(12) United States Patent
Harik

(10) Patent No.: US 10,763,893 B2
(45) Date of Patent: Sep. 1, 2020

(54) METHOD FOR DATA COMPRESSION

(71) Applicant: Georges Harik, Palo Alto, CA (US)

(72) Inventor: Georges Harik, Palo Alto, CA (US)

( * ) Notice: Subject to any disclaimer, the term of this patent is extended or adjusted under 35 U.S.C. 154(b) by 322 days.

(21) Appl. No.: 15/654,632

(22) Filed: Jul. 19, 2017

(65) Prior Publication Data

US 2018/0026649 A1   Jan. 25, 2018

Related U.S. Application Data

(60) Provisional application No. 62/364,773, filed on Jul. 20, 2016.

(51) Int. Cl.
*H03M 7/30* (2006.01)
*G06N 20/00* (2019.01)
*G06N 3/04* (2006.01)
*G06N 3/08* (2006.01)
*G06N 3/063* (2006.01)

(52) U.S. Cl.
CPC ............ *H03M 7/30* (2013.01); *G06N 3/0454* (2013.01); *G06N 3/08* (2013.01); *G06N 20/00* (2019.01); *H03M 7/3082* (2013.01); *G06N 3/063* (2013.01); *H03M 7/3071* (2013.01)

(58) Field of Classification Search
CPC .... H03M 7/30; H03M 7/3082; H03M 7/3071; G06N 20/00; G06N 3/0454; G06N 3/08; G06N 3/063
USPC ........................................................ 707/693
See application file for complete search history.

(56) References Cited

U.S. PATENT DOCUMENTS

| | | | | |
|---|---|---|---|---|
| 5,598,354 A | * | 1/1997 | Fang .................... | G06N 3/0454 708/203 |
| 5,832,443 A | * | 11/1998 | Kolesnik ............. | G10L 19/0212 704/500 |
| 7,684,981 B2 | * | 3/2010 | Thumpudi .............. | G10L 19/03 704/205 |

(Continued)

OTHER PUBLICATIONS

Bengio, Yoshua, et al., "Estimating or Propagating Gradients Through Stochastic Neurons for Conditional Computation", arXiv.org, Cornell University, arXiv:1308.3432v1, uploaded: Aug. 15, 2013, 12 pages.*

(Continued)

*Primary Examiner* — Robert Stevens
(74) *Attorney, Agent, or Firm* — Edward C. Kwok; VLP Law Group, LLP

(57) ABSTRACT

A data compression system includes: (a) a data compression module that receives a sequence of input vectors and that provides a sequence of compressed vectors; (b) a data decompression module that receives the compressed vectors to provide a sequence of output vectors; and (c) a parameter update module that receives the sequence of input vectors and the sequence of output vectors, and which learns the data compression module and data decompression module based on evaluating a loss function of the input vectors, the output vectors, and the parameters controlling the compression module and the decompression module. Each input vector and its corresponding output vector may represent digitized time-domain signals (e.g., speech, audio or video signals) over a predetermined time period. The loss function may be evaluated for each of a sequence of predetermined time periods.

21 Claims, 1 Drawing Sheet

(56) References Cited

U.S. PATENT DOCUMENTS

| | | | | |
|---|---|---|---|---|
| 8,223,837 B2* | 7/2012 | Sun | ................... | H04N 19/132 |
| | | | | 375/240.08 |
| 2007/0016406 A1* | 1/2007 | Thumpudi | ............ | G10L 19/008 |
| | | | | 704/205 |
| 2007/0016418 A1* | 1/2007 | Mehrotra | ............ | G10L 19/0017 |
| | | | | 704/240 |
| 2009/0067491 A1* | 3/2009 | Sun | ................... | H04N 19/132 |
| | | | | 375/240.03 |
| 2012/0008681 A1* | 1/2012 | Lundin | ................ | H04N 19/895 |
| | | | | 375/240.12 |
| 2013/0325775 A1* | 12/2013 | Sinyavskiy | ............ | G06N 20/00 |
| | | | | 706/25 |
| 2014/0132429 A1* | 5/2014 | Scoville | .................. | H03M 7/30 |
| | | | | 341/87 |

OTHER PUBLICATIONS

Schmidhuber, Jurgen, et al., "On Learning to Think: Algorithmic Information Theory for Novel Combinations of Reinforcement Learning Controllers and Recurrent Neural World Models", arXiv.org, Cornell University, arXiv:1511.09249v1, uploaded: Nov. 30, 2015, 36 pages.*

"Fast Fourier Transform", Wikipedia, downloaded from: en.wikipedia.org/wiki/Fast_Fourier_transform on Aug. 3, 2019, 9 pages.*

* cited by examiner

METHOD FOR DATA COMPRESSION

CROSS REFERENCE TO RELATED APPLICATIONS

The present application relates to and claims priority of U.S. provisional patent application ("Provisional Application"), Ser. No. 62/364,773, entitled "Method for Data Compression," filed on Jul. 20, 2016. The Provisional Patent Application is hereby incorporated by reference in its entirety.

BACKGROUND OF THE INVENTION

1. Field of the Invention

The present invention relates to data compression using machine learning techniques. In particular, the present invention relates to data compression for improved communication and storage efficiencies, such as desirable in applications involving speech, audio data and video data.

2. Discussion of the Related Art

In machine learning, an optimizing predictive model is a computational model that learns a function that receives certain input values. One type of optimizing predictive model applies a stochastic gradient descent optimization technique over a loss function. One example of a loss function may be, for example, the difference ("error") between the output of the predictive model and the desired output. Typically, the optimization procedure involves iteratively executing the model using training data, and then differentiating the model to adapt the values of the model parameters to minimize the loss function. The goal is, over the course of the training, the optimizing predictive model is adapted to perform the function to be learned, which can then be applied to data outside of the training data.

An optimizing predictive model may be implemented, for example, in a neural network model. A neural network model is usually based on a graph consisting of nodes (referred to as "neurons") and a set of directed, weighted edges that connect the neurons. The goal of the training is to achieve a directed graph that represents the function to be learned. In a typical implementation, each neuron is assigned a simple computational task (e.g., a linear transformation followed by a non-linear function, such as a logistic function) and the loss function is computed over the entire neural network model. The parameters of the neural network model are typically determined ("learned") using a method that minimizes the loss function. Stochastic gradient descent is a method that is often used to achieve the minimization. In stochastic gradient descent, optimization is achieved iteratively by (a) finding analytical gradients for the loss functions and (b) perturbing or moving the test values by a small amount in the direction of the gradient, until the loss function is minimized.

In multimedia applications (e.g., an audio or video recording), it is often necessary to compress the data to achieve data communication or storage efficiencies. In addition to eliminating information redundancy, data compression often takes advantage of knowledge of the human senses of perception. For example, in speech encoding, data compression has long been achieved using a linear prediction technique ("LPC") technique, in which speech signals are analyzed for a set of recognized resonant patterns of the human vocal tract ("formants"), which are then encoded separately from the remainder of the speech signal. The formants may be represented by significantly less bits than the raw speech signal, thereby achieving data compression. Likewise, video encoding often takes advantage of knowledge of the human psycho-visual perception of light intensities and sensitivities to specific colors. However, such approaches result in complex compression and decompression algorithms which are difficult to optimize.

SUMMARY

According to one embodiment of the present invention, a data compression system includes: (a) a data compression module that receives a sequence of input vectors and that provides a sequence of compressed vectors, the data compression module implementing a computational model characterized by a first set of parameters; (b) a data decompression module that receives the compressed vectors to provide a sequence of output vectors, the data decompression module implementing a computational model characterized by a second set of parameters; and (c) a parameter update module that receives the sequence of input vectors and the sequence of output vectors, and which updates values of the first set of parameters and the second set of parameters based on a loss function of the input vectors, the output vectors, the first set of parameters and the second set of parameters. Each input vector and a corresponding output vector may represent digitized time-domain signals (e.g., speech, audio or video signals) over a predetermined time period. The loss function may be evaluated for each predetermined time period.

According to one embodiment of the present invention, the parameter update module updates the first and second sets of parameters based on a stochastic gradient descent method.

According to one embodiment of the present invention, the data compression module and the data decompression module are each implemented by a neural network computational model.

In one implementation, the data compressor and decompressor pair in a system may be personalized to the voice of a specific individual to allow reproduction (i.e., decompression) at a high fidelity, even with a small decompressor and at a high compression ratio. Such a system is particularly useful in telephone and teleconferencing applications.

The present invention is better understood upon consideration of the detailed description below.

BRIEF DESCRIPTION OF THE DRAWINGS

To simplify cross-reference among like elements across the figures, like elements in the figures are assigned like reference numerals.

DETAILED DESCRIPTION OF THE PREFERRED EMBODIMENTS

Figure 1:
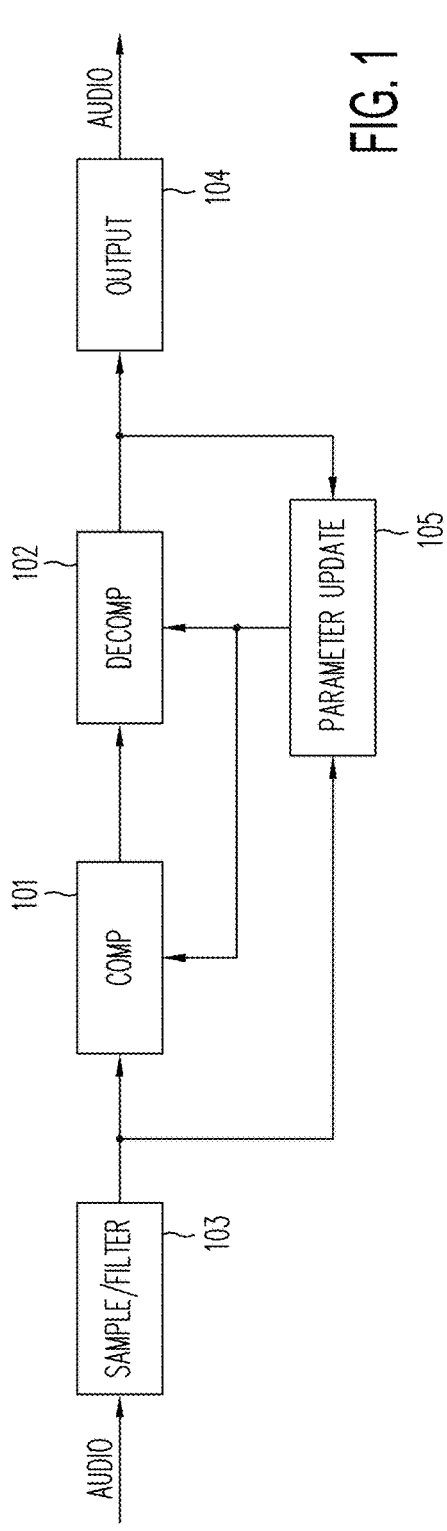
FIG. 1 is a block diagram of compressor-decompressor system 100, which includes data compressor 101 and data decompressor 102 that are trained together, in accordance with one embodiment of the present invention.

FIG. 1 is a block diagram compressor-decompressor system 100, which includes data compressor 101 and data decompressor 102 that are trained together, in accordance with one embodiment of the present invention. To facilitate discussion herein, compressor-decompressor system 100 of FIG. 1 is described as representing an exemplary system for compression and decompression of audio signals. However, the systems and methods of the present invention are not so limited. The present invention is applicable to any data or signal compression including text, speech, audio or video signal compression and signals used in other multimedia applications. As shown in FIG. 1, analog input signals, such as audio signals from one or more source channels, are sampled and filtered in signal preprocessing subsystem 103. Therefore, signal processing subsystem 103 may provide, for example, a digital data stream of 16-bit samples at 16 KHz, such that 16,000 16-bit samples are available every second for compression. In one embodiment, compression may be performed for data collected over fixed-length time periods (e.g., each second). Compressor 101 takes the input samples for each compression period (e.g., 1 second) and compresses it into, for example, a 8000-bit output compressed vector, to achieve a 32:1 compression. (A rule of thumb has been developed over experience in audio processing that 16-bit samples can be compressed to 1-bit per sample on the average, without significant loss of fidelity to the human listener.) From each 8000-bit value, decompressor 102 provides as output 16,000 16-bit samples. The 16000 16-bit samples may then be digital-to-analog converted and filtered in output module 104 to reproduce the input audio signal over the decompression period. Of course, the sampling frequency, the number of bits per sample and the size of the compressed vector are selected herein merely for illustrative purpose. In actual practice, these quantities may be varied for performance and fidelity as desired.

During the time period when compressor-decompressor system 100 is trained, both the input vectors to compressor 101 of each compression period and the corresponding output vectors at decompressor 102 are provided to parameter update unit 105. A loss function based on these input and output vectors is evaluated multiple times and processed to provide updates to the parameter values so as to adaptively determine the functions implemented in compressor 101 and decompressor 102. The loss function may be evaluated at regular time intervals, e.g., when an input vector and its corresponding output vector are available. For example, in one embodiment, the input vectors and the output vectors may each be a 16,000-dimensional vector. According to one embodiment of the present invention, the output vector is a function of the input vector and both the model parameters of compressor 101 and decompressor 102. In one embodiment, to evaluate the loss function, a 2-norm value between the two vectors for each compression period (i.e., the square of the Euclidean distance between the input and output vectors) is calculated. (The loss function may be a function of the 2-norm values of multiple compression periods.) Initially, i.e., at the beginning of the training process, the model parameters of compressor 101 and decompressor 102 may be each initialized to any suitable value (e.g., 0).

The training process is expected to move the value of each model parameter in a way that minimizes the loss function. According to one embodiment of the present invention, in which the method of stochastic gradient descent is used, a gradient of the loss function is the calculated to drive the optimization process. (The gradient may be, for example, the derivative of the loss function with respect to each model parameter). In some embodiments, a "straight-through estimator" approach may be used, regardless of any non-linearity that may exist in the underlying data processing structures. Based on the gradient, the model parameters in both compressor 101 and decompressor 102 are updated so that the resulting evaluations of the computational models in compressor 101 and decompressor 102 would result in a reduced value in the loss function. In one embodiment, each model parameter is updated by multiplying the gradient with a small negative value, projecting the product on the model parameter, and adjusting the model parameter accordingly to achieve the reduced loss function). Reinforcement learning techniques may also be applied. In addition, any other suitable technique to improve performance may also be applied. For example, the techniques disclosed by Georges Harik in U.S. patent application Ser. No. 14/165,431, entitled "METHOD FOR AN OPTIMIZING PREDICTIVE MODEL USING GRADIENT DESCENT AND CONJUGATE RESIDUALS," filed on Jan. 27, 2014, may also be used.

In one embodiment, compressor-decompressor system 100 is trained using audiobooks (i.e, audio recordings in which text is read aloud). As compressor-decompressor system 100 may be implemented as relatively small programs, even for a high compression ratio, the decompression module can be stored or transmitted with the compressed data for customized decompression. In fact, the compressor-decompressor systems of the present invention may be used in mobile applications (e.g., smartphones). For example, in one application, trained decompressors can be exchanged at the beginning of a communication session among communicating participants prior to communicating the compressed data. The inventor discovered that the compressor-decompressor system 100 may be easily trained to become personalized to a specific speaker (e.g., trained to become particular efficient for compressing speech of a particular speaker). Such personalized compressor-decompressor systems are particularly desirable for telephone or teleconference applications.

The methods of the present invention may be implemented, for example, in a neural network model. In one embodiment of the present invention, compressor 101 and decompressor 102 may each be implemented as a neural network in a computational environment that includes a number of parallel processors. In one implementation, in which audio signals sampled at 16 KHz are used, with data compressed to 8,000 bits per second, compressor 101 and decompressor 102 may each be implemented by a neural network of 2.5 million nodes. Each parallel processor, which may be provided by a graphics processor, may implement multiple nodes to take advantage of computational structures optimized for arithmetic operations, as is typical in such graphics processors. Alternatively, each processor may also be implemented by a custom circuit optimized for implementing neural network model elements. A host computer system using conventional programming techniques may configure compressor-decompressor system 100. Of course, each neuron in the neural network model may also be implemented by a customized circuit.

Figure 2:
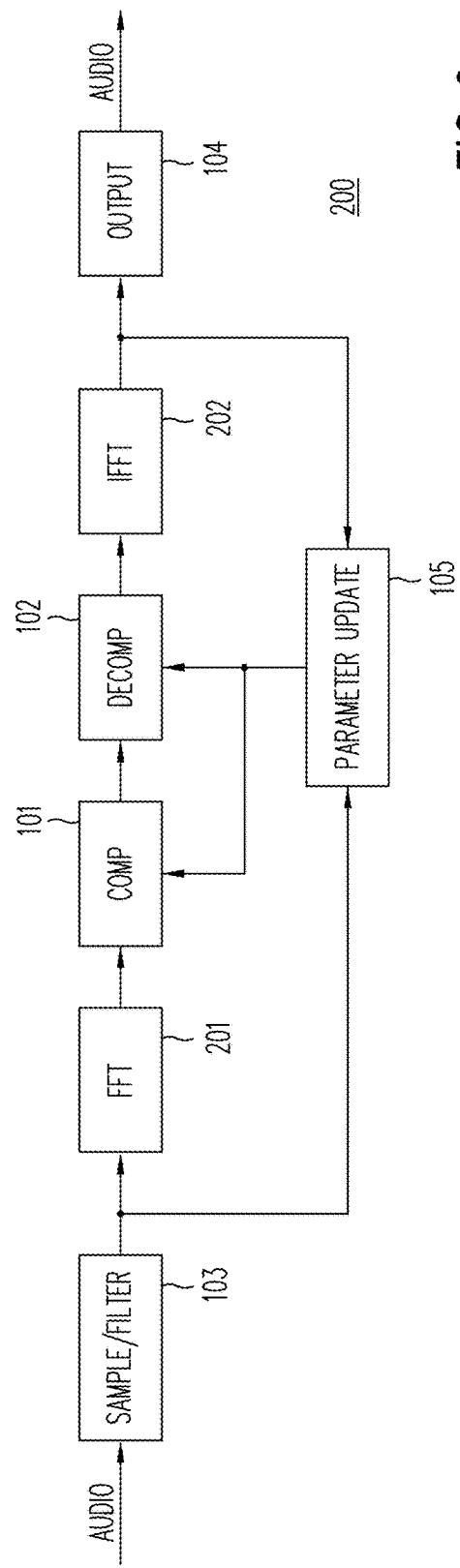
FIG. 2 is a block diagram of compressor-decompressor system 200, which includes data compressor 101 and data decompressor 102 that are trained together and that process data in the frequency domain, in accordance with a second embodiment of the present invention.

A compression-decompression system can also process data in the frequency domain. FIG. 2 is a block diagram of compressor-decompressor system 200, which includes data compressor 101 and data decompressor 102 that are trained together and that process data in the frequency domain, in accordance with a second embodiment of the present invention. In FIG. 2, a fast fourier transform (FFT) is performed on the sampled audio data in FFT module 201 prior to being provided to compressor 101. Correspondingly, an inverse fast fourier transform (iFFT) is performed on the decompressed data from decompressor 102 in iFFT module 202 to provide time-domain digital output data to output module 104. In this embodiment, parameter updates may be performed using time domain data, as shown in FIG. 2.

The above detailed description is provided to illustrate the specific embodiments of the present invention and is not intended to be limiting. Various modification and variations within the scope of the present invention are possible. The present invention is set forth in the following claims.

I claim:

1. A data compression system, comprising:
a data compressor, implemented in a computational environment of parallel processors, that receives a sequence of input vectors and that provides a sequence of compressed vectors, wherein the total number of data bits representing the input vectors is greater than the number of data bits representing the compressed vectors and wherein the data compressor is configured according to a first set of parameters; and
a data decompressor, implemented in the computational environment, that receives the compressed vectors and that provides a sequence of output vectors, wherein the total number of data bits representing the output vectors is greater than the total number of data bits representing the compressed vectors and wherein the data decompressor is configured according to a second set of parameters, wherein the first set of parameters and the second set of parameters are updated after a time interval based on a loss function of (i) a difference between at least one of the input vectors received during the time interval and at least one of the output vectors received during that time interval, (ii) the first set of parameters and (iii) the second set of parameters.

2. The data compression system of claim 1, wherein the data compressor receives one input vector and the data decompressor provides one corresponding output vector over a predetermined time period.

3. The data compression system of claim 2, wherein the loss function is evaluated for each predetermined time period.

4. The data compression system of claim 1, wherein the first and second sets of parameters are updated using a stochastic gradient descent method.

5. The data compression system of claim 4, wherein the stochastic gradient descent method uses a straight-through estimator.

6. The data compression system of claim 1, wherein the values of the first and second sets of parameters are updated using reinforcement learning techniques.

7. The data compression system of claim 1, wherein the sequence of input vectors and the sequence of output vectors each represent digitized audio signals.

8. The data compression system of claim 1, wherein the data compressor further carries out a fast fourier transform (FFT) on each input vector, and wherein the data decompressor further carries out an inverse fast fourier transform (iFFT) on each output vector.

9. The data compression system of claim 1, wherein each output vector is a function of: (i) a corresponding input vector, and (ii) both the first and second sets of parameters.

10. The data compression system of claim 1, wherein the computation environment comprises one or more neural networks.

11. In a computational environment of parallel processors, a method of data compression, comprising:
training a data compressor and a corresponding data decompressor wherein the data compressor and the data decompressor are configured according to a first set of parameters and a second set of parameters, respectively; and
compressing input data using the trained data compressor and decompressing the compressed input data using the trained data decompressor, wherein training the data compressor and the data decompressor comprises updating, after a time interval, the first set of parameters and the second set of parameters based on evaluating a loss function of a difference between at least one of the input vectors received during the time interval and at least one of the output vectors provided during the time interval, the first set of parameters and the second set of parameters.

12. The method of claim 11, wherein the trained data decompressor is stored with the compressed input data.

13. The method of claim 11, further comprising sending to a recipient the data decompressor prior to decompressing the compressed input data.

14. The method of claim 11, wherein the data compressor receives one input vector and the data decompressor provides one corresponding output vector over a predetermined time period.

15. The method of claim 11, wherein the loss function is evaluated for each predetermined time period.

16. The method of claim 11, wherein the parameters are updated according to a stochastic gradient descent method.

17. The method of claim 16, wherein the stochastic gradient descent method uses a straight-through estimator.

18. The method of claim 11, wherein iteratively updating the first set of parameters and the second set of parameters apply reinforcement learning techniques.

19. The method of claim 11, wherein the data compressor and the data decompressor process data in the frequency domain.

20. The method of claim 11, wherein each output vector is a function of: (i) a corresponding input vector, and (ii) both the first and second sets of parameters.

21. The method of claim 11, wherein the computation environment comprises one or more neural networks.

* * * * *